US008993995B2

(12) United States Patent
Miyata

(10) Patent No.: US 8,993,995 B2
(45) Date of Patent: Mar. 31, 2015

(54) LIGHT-EMITTING ELEMENT, METHOD OF PRODUCING LIGHT-EMITTING ELEMENT, AND DISPLAY DEVICE

(71) Applicant: Murata Manufacturing Co., Ltd., Nagaokakyo-shi, Kyoto-fu (JP)

(72) Inventor: Haruya Miyata, Nagaokakyo (JP)

(73) Assignee: Murata Manufacturing Co., Ltd., Nagaokakyo-Shi, Kyoto-Fu (JP)

(*) Notice: Subject to any disclaimer, the term of this patent is extended or adjusted under 35 U.S.C. 154(b) by 206 days.

(21) Appl. No.: 13/678,630

(22) Filed: Nov. 16, 2012

(65) Prior Publication Data

US 2013/0069036 A1 Mar. 21, 2013

Related U.S. Application Data

(63) Continuation of application No. PCT/JP2011/060956, filed on May 12, 2011.

(30) Foreign Application Priority Data

May 24, 2010 (JP) ................. 2010-118212

(51) Int. Cl.
*H01L 33/00* (2010.01)
*H01L 33/06* (2010.01)
(Continued)

(52) U.S. Cl.
CPC .......... *H01L 33/06* (2013.01); *B82Y 20/00* (2013.01); *C09K 11/025* (2013.01); *C09K 11/565* (2013.01); *C09K 11/883* (2013.01);
(Continued)

(58) Field of Classification Search
USPC ............................................. 257/13; 438/35
See application file for complete search history.

(56) References Cited

U.S. PATENT DOCUMENTS 7,615,800 B2  11/2009  Kahen
8,334,527 B2  12/2012  Iizumi et al.
(Continued)

FOREIGN PATENT DOCUMENTS

CN    1759160 A     4/2006
JP    2008-288171 A  11/2008
(Continued)

OTHER PUBLICATIONS

Machine translation, Tanaka, Japanese Patent Publication No. H11-354839, translation date: Sep. 13, 2014, JPO & Japio, all pages.*
(Continued)

*Primary Examiner* — Fernando L. Toledo
*Assistant Examiner* — Victoria K Hall
(74) *Attorney, Agent, or Firm* — Dickstein Shapiro LLP

(57) ABSTRACT

A light-emitting element where a positive electrode is formed on the surface of a transparent substrate; a hole transport layer is formed on the surface of the positive electrode; and a light-emitting layer made of quantum dots is formed on the surface of the hole transport layer. The light-emitting layer has a light-emitting region that emits light of a first predetermined wavelength in which a surfactant is present on the surface of the quantum dots and a non-light-emitting region that does not emit light in which a surfactant is absent on the surface of the quantum dots. A second light-emitting layer that emits light of a second predetermined wavelength is formed on the surface of the light-emitting layer, and a negative electrode is formed on the surface of the second light-emitting layer.

18 Claims, 7 Drawing Sheets

(51) Int. Cl.

| | | |
|---|---|---|
| *B82Y 20/00* | (2011.01) | |
| *C09K 11/02* | (2006.01) | |
| *C09K 11/56* | (2006.01) | |
| *C09K 11/88* | (2006.01) | |
| *H01L 51/50* | (2006.01) | |
| *H05B 33/14* | (2006.01) | |
| *H01L 27/32* | (2006.01) | |
| *H01L 51/00* | (2006.01) | |

(52) U.S. Cl.
CPC ............. *H01L51/502* (2013.01); *H05B 33/14* (2013.01); *H01L 33/005* (2013.01); *H01L 27/3211* (2013.01); *H01L 51/0026* (2013.01); *H01L 51/504* (2013.01)
USPC .............................................. 257/13; 438/35

(56) References Cited

U.S. PATENT DOCUMENTS

| | | |
|---|---|---|
| 2006/0170331 A1 | 8/2006 | Bertram et al. |
| 2007/0215856 A1* | 9/2007 | Kwon et al. ................. 257/14 |
| 2009/0087546 A1 | 4/2009 | Iizumi et al. |
| 2009/0152664 A1 | 6/2009 | Klem et al. |
| 2010/0108984 A1 | 5/2010 | Cho et al. |
| 2010/0184278 A1* | 7/2010 | Oh ................................ 438/493 |
| 2010/0213438 A1* | 8/2010 | Cho et al. ...................... 257/13 |
| 2013/0009131 A1* | 1/2013 | Kazlas et al. .................. 257/13 |

FOREIGN PATENT DOCUMENTS

| | | |
|---|---|---|
| JP | 2009-087760 A | 4/2009 |
| JP | 2009-087781 A | 4/2009 |
| JP | 2009-087782 A | 4/2009 |
| JP | 2009-087783 A | 4/2009 |
| JP | 2010-114079 A | 5/2010 |
| WO | WO-2007-037882 A1 | 4/2007 |

OTHER PUBLICATIONS

Machine translation, Tanaka, Japanese Patent Publication No. H10-79501, translation date: Sep. 13, 2014, JPO & Japio, all pages.*

S. Tanaka et al., Self-assembling GaN quantum dots on $Al_xGa(1-x)N$ surfaces using a surfactant, Dec. 23, 1996, Applied Physics Letters, American Institute of Physics, vol. 69, No. 26, pp. 4096-4098.*

W. Huynh et al., Controlling the Morphology of Nanocrystal-Polymer Composites for Solar Cells, Jan. 2003, Advanced Functional Materials, Wiley-VCH Verlag GmbH & Co. KGaA, Weinheim, vol. 13, No. 1, pp. 73-79.*

M. Drindic et al., Transport properties of annealed CdSe colloidal nanocrystal solids, Dec. 15, 2002, Journal of Applied Physics, American Institute of Physics, vol. 92, No. 12, pp. 7498-7503.*

S. Besson et al., 3D Quantum Dot Lattice Inside Mesoporous Silica Films, Feb. 7, 2002, Nano Letters, American Chemical Society, vol. 2, No. 4, pp. 409-414.*

Machine translation, Office Action, Application No. CN 201180025257.7, the State Intellectual Property Office of the People's Republic of China, translation date: Feb. 11, 2015, translation by Espacenet, all pages.*

Renguo Xie et al., Synthesis and Characterization of Highly Luminescent CdSe-Core $CdS/Zn0.5Cd0.5S/ZnS$ Multishell Nanocrystals, J. Am. Chem. Soc., 2005, American Chemical Society, vol. 127, pp. 7480-7488, all pages.*

PCT/JP2011/060956 Written Opinion dated Jul. 13, 2011.

PCT/JP2011/060956 International Search Report dated Jul. 13, 2011.

Chinese Office Action dated Nov. 25, 2014 to corresponding Chinese application No. 201180025257.7.

* cited by examiner (a)

(b)

(c)

(d)

(a)

(b)

(c)

(d)

LIGHT-EMITTING ELEMENT, METHOD OF PRODUCING LIGHT-EMITTING ELEMENT, AND DISPLAY DEVICE

CROSS REFERENCE TO RELATED APPLICATIONS

The present application is a continuation of International application No. PCT/JP2011/060956, filed May 12, 2011, which claims priority to Japanese Patent Application No. 2010-118212, filed May 24, 2010, the entire contents of each of which are incorporated herein by reference.

FIELD OF THE INVENTION

The present invention relates to a light-emitting element, a method of producing a light-emitting element, and a display device, and more particularly to a light-emitting element having at least one light-emitting layer formed of quantum dots, a method of producing the light-emitting element, and a display device such as a full-color display using the light-emitting element.

BACKGROUND OF THE INVENTION

Quantum dots which are ultrafine particles having a particle size of 10 nm or less are excellent in confinement of carriers (electrons, holes), so that excitons can be easily generated by recombination of electrons-holes. For this reason, light emission from free excitons can be expected, and light emission having a high light-emission efficiency and a sharp light-emission spectrum can be realized. Also, because the quantum dots can be controlled in a wide wavelength range using the quantum size effect, a light-emitting element containing quantum dots in a light-emitting layer has been attracting attention and has been eagerly studied and developed in recent years.

For example, Patent Document 1 proposes a method of producing an electroluminescence (hereafter referred to as "EL") element in which a light-emitting layer containing quantum dots is patterned by using the photolithography method, as shown in FIG. 8.

In this Patent Document 1, a first electrode layer 102 electrically insulated via an insulating layer 101 is formed on a substrate 103; a hole injection layer 104 is formed thereon; and a photoresist layer 105 is formed in a predetermined pattern so that the photoresist layer of a light-emitting region may be removed, as shown in FIG. 8(a).

Next, a light-emitting layer 106 is formed by using an application liquid containing quantum dots having a silane coupling agent coordinated thereto and a hole-transporting material, as shown in FIG. 8(b).

Next, the photoresist layer 105 is exposed via a photomask, developed thereafter with a photoresist developing liquid, and washed, whereby the remaining photoresist layer 105 is removed, and the light-emitting layer 106 on the photoresist layer 105 is lifted off, and thus a light-emitting layer 106a having a pattern form is formed, as shown in FIG. 8(c).

Finally, then, a second electrode layer 107 is formed on the light-emitting layer 106a, as shown in FIG. 8(d).

Also, Patent Document 2 proposes a method of producing an EL element in which a light-emitting layer containing quantum dots is patterned by using a layer in which the wettability changes by action of a photocatalyst accompanying energy radiation, as shown in FIG. 9.

In this Patent Document 2, a first electrode layer 112 electrically insulated via an insulating layer 111 is formed on a substrate 113, and a wettability changing layer 114 is formed thereon, as shown in FIG. 9(a). Here, the wettability changing layer 114 contains a photocatalyst and is constituted in such a manner that the wettability changes by energy radiation such as ultraviolet rays.

Next, ultraviolet rays are radiated onto the wettability changing layer 114 via a photomask. Then, by action of the photocatalyst contained in the wettability changing layer 114, the wettability changes in the irradiated part of the wettability changing layer 114 so that the contact angle to the liquid may decrease thereby to form a lyophilic region 115, and a liquid-repellent region 116 in which the wettability does not change is formed in the non-irradiated part, as shown in FIG. 9(b).

Then, when an application liquid containing quantum dots having a ligand such as a silane coupling agent coordinated thereto is applied onto the wettability layer 114, the application liquid is repelled in the liquid-repellent region 116 while the application liquid adheres in the lyophilic region 115, as shown in FIG. 9(c), whereby a light-emitting layer 117 is formed on the surface of the lyophilic region 115.

Finally, then, a second electrode layer 118 is formed on the light-emitting layer 117, as shown in FIG. 9(d).

Patent Document 1: Japanese Patent Application Laid-open (JP-A) No. 2009-87760 (claim 1, paragraph [0026], and FIG. 1)

Patent Document 2: Japanese Patent Application Laid-open (JP-A) No. 2009-87781 (claim 1, paragraphs [0034] to [0038], and FIG. 1)

SUMMARY OF THE INVENTION

However, in Patent Document 1, the light-emitting layer is patterned by the photolithography method. Therefore, in dissolving and removing the unnecessary photoresist 105 on the hole injection layer 104, the photoresist 105 cannot be completely removed, thereby raising a fear that a residue may be present on the hole injection layer 104. Then, when the residue of the photoresist 105 is present on the hole injection layer 104, there is a fear of inviting a decrease in the light-emission characteristics.

Also, in Patent Document 1, the patterning is carried out with use of a photoresist. Therefore, for the hole injection layer 104, there is a need to select a material having a chemical resistance against exposure to a series of photolithography processes, thereby raising a problem in that there is a restriction on the material selection.

Also, in Patent Document 2, the wettability changing layer 114 having no relation to the light-emission characteristics is interposed between the light-emitting layer 117 and the first electrode layer 112, so that the resistance of the EL element will be high, thereby raising a problem in that the driving voltage will be high.

Moreover, in Patent Document 2, the contact angle to the liquid changes greatly at the boundary between the irradiated part and the non-irradiated part of the ultraviolet rays, so that the change in film thickness at such a part will be large. For this reason, there is a fear that unevenness may be generated in the light-emission characteristics.

The present invention has been made in view of such circumstances, and an object thereof is to provide a light-emitting element in which patterning of a light-emitting region can be carried out easily without the need for cumbersome steps, and good light-emission characteristics can be obtained at a high efficiency and with a low cost, as well as a method of producing a light-emitting element and a display device using this light-emitting element.

With regard to the quantum dots which are ultrafine particles of a nanometer level, a surfactant is coordinated therearound in order to avoid agglomeration of the quantum dots with each other. This surfactant can inactivate the surface defects of the quantum dots and can confine the carriers (holes, electrons) effectively within the quantum dots by voltage application, whereby the holes and electrons are recombined within the quantum dots to allow exciton light-emission at a high efficiency.

On the other hand, when the surfactant on the quantum dot surface is removed, the surface defects are not inactivated, so that the excitons are trapped by the surface defects, and the excited energy is deactivated by thermal radiation to bring about a non-light-emission state. Then, this surfactant can be easily removed by performing a thermal treatment at a temperature around the boiling point.

Therefore, a light-emitting region and a non-light-emitting region can be formed by performing a thermal treatment on a specific region of the quantum dot layer, whereby a light-emitting element having good light-emission characteristics can be obtained easily and efficiently without using the photolithography method as in Patent Document 1 or without providing a wettability changing layer as in Patent Document 2.

The present invention has been made based on such a finding, and a light-emitting element according to the present invention is a light-emitting element comprising at least one or more light-emitting layers containing quantum dots interposed between electrodes, wherein at least one or more layers of the light-emitting layers have a light-emitting region in which a surfactant is present on the surface of the quantum dots and a non-light-emitting region in which a surfactant is absent on the surface of the quantum dots.

Also, in the light-emitting element of the present invention, it is preferable that the non-light-emitting region is made by a thermal treatment.

Also, when an electron transport layer having a light-emitting function is formed as a second light-emitting layer on the surface of the light-emitting layer, the leakage current passing through the surface defects from the quantum dots in the non-light-emitting region increases, whereby electric charge is concentrated in the second light-emitting layer to allow the second light-emitting layer to emit light. Therefore, light of a respectively different wavelength can be output from both the light-emitting layer and the second light-emitting layer.

Specifically, in the light-emitting element of the present invention, it is preferable that a second light-emitting layer is formed on the surface of the light-emitting layer.

Also, in the light-emitting element of the present invention, it is preferable that the second light-emitting layer is an electron transport layer.

Further, in the light-emitting element of the present invention, it is preferable that the light-emitting region and the second light-emitting layer each emit light having a respectively different wavelength.

Also, when the light-emitting layer is formed of a laminated body of quantum dot layers having different particle sizes and the light-emitting layers are laminated so that light emission can be made from the light-emitting region of each of the light-emitting layers, light having a respectively different wavelength can be output from each of the light-emitting layers by the quantum size effect.

Specifically, in the light-emitting element of the present invention, it is preferable that the light-emitting layer is formed of a laminated body of two or more kinds of quantum dot layers having different average particle sizes, and the light-emitting layers are laminated so that at least a part of the non-light-emitting region and at least a part of the light-emitting region may overlap with each other.

Further, in the light-emitting element of the present invention, it is preferable that each light-emitting region of the light-emitting layer emits light having a respectively different wavelength.

Also, in the light-emitting element of the present invention, it is preferable that an electron transport layer is formed on the surface of the light-emitting layer.

Further, in the light-emitting element of the present invention, it is preferable that a hole transport layer is interposed between one electrode and the light-emitting layer.

Also, in the light-emitting element of the present invention, it is preferable that the quantum dots have a core-shell structure.

Also, a method of producing a light-emitting element according to the present invention is a method of producing a light-emitting element including at least one or more light-emitting layers containing quantum dots interposed between electrodes, the method comprising a quantum dot fabricating step of fabricating at least one or more kinds of quantum dots having a surfactant coordinated on the surface; a quantum dot layer forming step of forming at least one or more quantum dot layers by using each of the quantum dots fabricated in the quantum dot fabricating step; and a surfactant removing step of performing a thermal treatment on a specific region of at least one quantum dot layer among the quantum dot layers to remove the surfactant on the specific region, and thus a light-emitting layer having a light-emitting region and a non-light-emitting region is fabricated.

Further, in the method of producing a light-emitting element of the present invention, it is preferable that a second light-emitting layer is formed on the surface of the light-emitting layer.

Also, in the method of producing a light-emitting element of the present invention, it is preferable that the second light-emitting layer is an electron transport layer.

Also, in the method of producing a light-emitting element of the present invention, it is preferable that two or more kinds of quantum dots having different average particle sizes are fabricated in the quantum dot fabricating step, and the quantum dot layer forming step and the surfactant removing step are carried out for plural times so that at least a part of the non-light-emitting region and at least a part of the light-emitting region may overlap with each other by using these quantum dots to form two or more light-emitting layers having different light-emission wavelengths.

Also, in the method of producing a light-emitting element of the present invention, it is preferable that an electron transport layer is formed on the surface of the uppermost light-emitting layer among the light-emitting layers.

Also, in a display device according to the present invention, numerous light-emitting elements described above are arranged in an array form.

According to the light-emitting element and method of producing a light-emitting element of the present invention, a light-emitting region defining light emission and non-light-emission can be patterned simply depending on whether a surfactant is present or not on the surface of the quantum dots contained in the light-emitting layer. Specifically, the light-emitting region can be patterned without using a cumbersome method such as the photolithography method. Therefore, a light-emitting element having good light-emission characteristics can be obtained at a high efficiency and with a low cost without the presence of a residue of the photoresist in the light-emitting layer and without the need for consideration of chemical resistance at the time of material selection. Also, the film thickness of the light-emitting layer can be controlled easily in the film forming process, so that the film thickness can be formed uniformly or approximately uniformly, and unevenness is not generated in the light-emission characteristics. Moreover, the element will not have high resistance as in Patent Document 2, so that the element can be driven by application of low voltage.

Also, when a second light-emitting layer is formed on the surface of the light-emitting layer, the part of the light-emitting layer corresponding to the non-light-emitting region can be allowed to emit light in the second light-emitting layer. Specifically, the leakage current passing through the surface defects from the quantum dots in the non-light-emitting region of the light-emitting layer increases, whereby electric charge is concentrated in the second light-emitting layer to allow the second light-emitting layer to emit light, and light of different wavelengths can be emitted from one light-emitting element. Moreover, since the second light-emitting layer serves also as an electron transport layer, the element structure can be simplified.

Also, when the light-emitting layer is formed of a laminated body of two or more kinds of quantum dot layers having different average particle sizes and the light-emitting layers are laminated so that at least a part of the non-light-emitting region and at least a part of the light-emitting region may overlap with each other, light of different colors can be emitted from the quantum dots of the same material by the quantum size effect from each of the light-emitting regions, so that a light-emitting element having good light-emission characteristics can be obtained at a high efficiency and with a low cost.

Also, according to the display device of the present invention, numerous light-emitting elements described above are arranged in an array form, so that a display device such as a full-color display can be obtained with a low cost.

In this manner, according to the present invention, the light-emission and non-light-emission of the light-emitting layer can be controlled simply depending on whether a surfactant is present or not on the surface of the quantum dots contained in the light-emitting layer, so that a small display device having high performance can be obtained at a high efficiency and with a low cost.

DETAILED DESCRIPTION OF THE INVENTION

Next, embodiments of the present invention will be described in detail with reference to the drawings.

Figure 1:
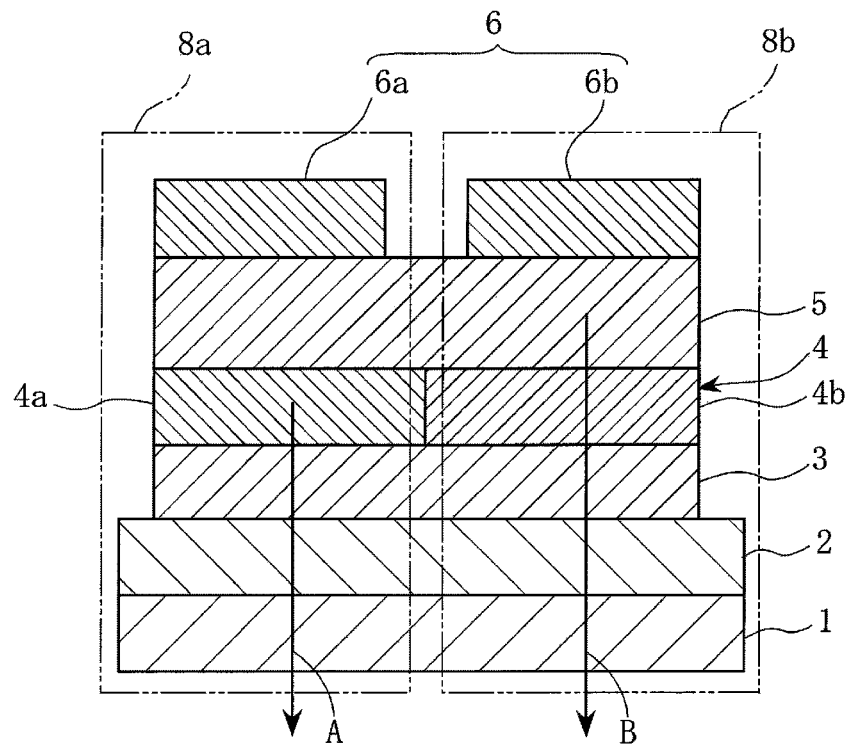
FIG. 1 is a cross-sectional view schematically illustrating one embodiment (first embodiment) of a light-emitting element according to the present invention.

FIG. 1 is a cross-sectional view schematically illustrating one embodiment (first embodiment) of a light-emitting element according to the present invention.

Specifically, in this light-emitting element, a positive electrode 2 is formed on the surface of a transparent substrate 1, and further a hole transport layer 3 is formed on the surface of the positive electrode 2.

Also, a light-emitting layer 4 made of quantum dots is formed on the surface of the hole transport layer 3. Then, the light-emitting layer 4 has a light-emitting region 4a that emits light of a first predetermined wavelength (for example, 622 nm) and a non-light-emitting region 4b that does not emit light.

On the surface of the light-emitting layer 4, a second light-emitting layer 5 that emits light of a second predetermined wavelength (for example, 525 nm) that is different from the light emitted from the light-emitting region 4a is formed, and further a negative electrode 6 (first negative electrode 6a, second negative electrode 6b) is formed on the surface of the second light-emitting layer 5. Specifically, the first negative electrode 6a is formed above the light-emitting region 4a, and the second negative electrode 6b is formed above the non-light-emitting region 4b, whereby the light-emitting element is sectioned into a first element part 8a and a second element part 8b, as shown in FIG. 1. Here, in the present embodiment, the second light-emitting layer 5 serves also as an electron transport layer.

Figure 2:
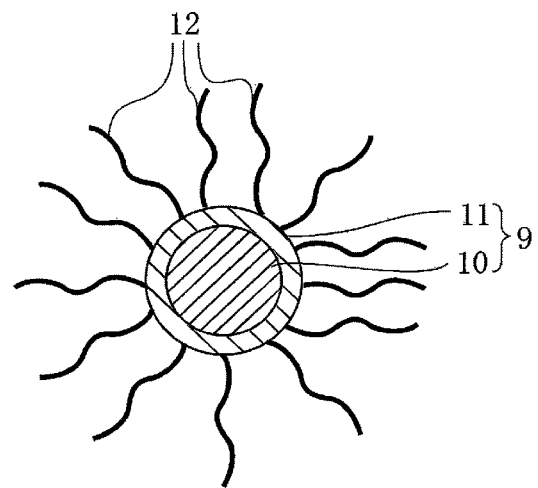
FIG. 2 is a view schematically illustrating a state in which a surfactant is coordinated on the surface of a quantum dot.

FIG. 2 is a cross-sectional view schematically illustrating a quantum dot contained in the light-emitting layer 4.

Specifically, this quantum dot 9 has a core-shell structure made of a core part 10 and a shell part 11 that protects the core part 10, and a surfactant 12 is coordinated on the surface of the shell part 11. Then, by this surfactant 12, agglomeration of the quantum dots 9 with each other is avoided.

In the quantum dots 9 contained in the light-emitting region 4a, the surfactant 12 is coordinated to be present on the surface. In the quantum dots 9 contained in the non-light-emitting region 4b, the surfactant 12 is removed to be absent on the surface.

Specifically, in the light-emitting region 4a, the surfactant 12 is coordinated to be present on the quantum dots 9, that is, on the surface of the shell part 11, so that the surface defects of the quantum dots 9 are inactivated. Moreover, the surfactant 12 used in the quantum dots 9 generally has a low carrier transport property, so that the electrons and the holes are attracted to be confined effectively in the inside of the quantum dots 9 and recombined in the quantum dots 9 by voltage application between the positive electrode 2 and the negative electrode 6, whereby exciton light emission is made at a high efficiency.

On the other hand, in the non-light-emitting region 4b, the surfactant 12 is not present on the quantum dots 9, that is, on the surface of the shell part 11, so that the surface defects of the quantum dots 9 are not inactivated. Therefore, the carriers are trapped by the surface defects, and the excitons lose energy to be deactivated with no radiation to bring about a non-light-emission state. Moreover, in this case, the leakage current from the quantum dots 9 that has passed through the surface defects increases, and electric charge is concentrated in the second light-emitting layer 5, whereby the second light-emitting layer 5 located above the non-light-emitting region 4b undergoes exciton light emission. This surfactant 12 can be easily removed by a thermal treatment around the boiling point, so that the light-emitting layer 4 having the light-emitting region 4a and the non-light-emitting region 4b can be formed simply by performing the thermal treatment on a specific region of the quantum dot layer.

Here, the core material for forming the core part 10 of the quantum dots 9 is not particularly limited as long as it is a semiconductor material exhibiting a photoelectric conversion function, and ZnSe, ZnTe, InP, InSe, CdSe, CdS, PbSe, and the like can be used. Also, as the shell material for forming the shell part 11, ZnS, GaN, AlP, and the like can be used, for example.

Also, the surfactant 12 is not particularly limited as long as it can be easily removed by a thermal treatment such as laser radiation, and long-chain amines such as hexadecylamine (hereafter referred to as "HDA") and octylamine, trioctylphosphine oxide, pyridine, and the like can be used.

Here, the transparent substrate 1 is not particularly limited, and inorganic materials such as glass and transparent resins such as polycarbonate and polyacrylate can be used, for example.

As the positive electrode 2, it is preferable to use a transparent and electrically conductive material having a large work function so as to facilitate injection of holes, and indium tin oxide (hereafter referred to as "ITO") and zinc oxide materials such as zinc oxide-indium oxide can be used, for example.

As the negative electrode 6, it is preferable to use an electrically conductive material having a small work function so as to facilitate injection of electrons, and Al and Ca can be used, for example.

Also, as a hole-transporting material that forms the hole transport layer 3, inorganic oxides such as nickel oxide (NiO) and molybdenum oxide ($MoO_3$), arylamine derivatives such as bis(N-(1-naphthyl-N-phenyl)-benzidine, triphenylamine derivatives such as copoly[3,3'-hydroxy-tetraphenylbenzidine/diethylene glycol]carbonate, N,N'-bis-(3-methylphenyl)-N,N'-bis-(phenyl)-benzidine (TPD), and 4,4,4-tris(3-methylphenylphenylamino)triphenylamine, carbazole derivatives such as polyvinylcarbazole and 4,4-N,N'-dicarbazole-biphenyl, distyrylarylene derivatives such as 1,4-bis(2,2-diphenylvinyl)benzene, fluorene derivatives such as poly[(9,9-dioctylfluorenyl-2,7-diyl)-co-(4,4'-(N-(4-sec-butylphenyl))diphenylamine)], and spiro compounds such as poly[(9,9-dioctylfluorenyl-2,7-diyl)-alt-co-(9,9'-spiro-bifluorene-2,7-diyl)] can be used, for example.

Also, as an electron-transporting material that forms the electron transport layer 5, aluminum complexes such as tris(8-hydroxyquinoline)aluminum (hereafter referred to as "Alq3") and bis(2-methyl-8-quinolylato)-4-phenylphenolato)aluminum, oxadiazoles such as (2-(4-biphenylyl)-5-(4-tert-butylphenyl)-1,3,4-oxadiazole), phenanthrolines such as 2,9-dimethyl-4,7-diphenyl-1,10-phenanthroline and 4,7-diphenyl-1,10-phenanthroline can be used, for example.

In the light-emitting element constituted in this manner, when voltage is applied between the negative electrode 6 (first negative electrode 6a and second negative electrode 6b) and the positive electrode 2, electrons are injected into the negative electrode 6, and holes are injected into the positive electrode 2. Then, the electrons injected into the negative electrode 6 pass through the electron transport layer 5 to enter the quantum dots 9 of the light-emitting layer 4, and the holes injected into the positive electrode 2 pass through the hole transport layer 3 to enter the quantum dots 9 of the light-emitting layer 4.

Then, in the first element part 8a, the surfactant 12 is coordinated to be present on the surface of the quantum dots 9 contained in the light-emitting layer 4, so that the light-emitting layer 4 forms the light-emitting region 4a as described above and generates exciton light-emission at a high efficiency. Specifically, in the first element part 8a, excitation light from the light-emitting region 4a of the light-emitting layer 4 penetrates through the hole transport layer 3, the positive electrode 2, and the glass substrate 1, as shown by an arrow A, and outputs a predetermined light-emission color (for example, red light).

On the other hand, in the second element part 8b, the surfactant 12 is not present on the surface of the quantum dots 9 contained in the light-emitting layer 4, so that the light-emitting layer 4 forms the non-light-emitting region 4b as described above. Then, the leakage current from the quantum dots 9 that has passed through the surface defects increases, and electric charge is concentrated in the second light-emitting layer 5, whereby the second light-emitting layer 5 located above the non-light-emitting region 4b generates exciton light-emission. Specifically, in the second element part 8b, excitation light from the second light-emitting layer 5 penetrates through the non-light-emitting region 4b, the hole transport layer 3, the positive electrode 2, and the glass substrate 1, as shown by an arrow B, and outputs a predetermined light-emission color (for example, green light).

Next, a method of producing the above light-emitting element will be described in detail.

First, a quantum dot dispersion solution is fabricated. Here, for the ultrafine particles constituting the quantum dots 9, various materials can be used as described above; however, in the embodiments described below, description will be given by taking, as an example, a case where CdSe is used in the core part 10 and ZnS is used in the shell part 11.

For example, cadmium acetate, oleic acid, and octadecene are mixed in a vessel and stirred and dissolved in a nitrogen atmosphere, whereby a cadmium precursor solution is prepared. Further, selenium and octadecene are mixed in a nitrogen atmosphere, whereby a selenium precursor solution is prepared.

Subsequently, the cadmium precursor solution is heated to a predetermined temperature (for example, 300° C.), and the selenium precursor solution is injected into this heated solution. Then, the precursors having a high activity react with each other by high temperature, whereby cadmium and selenium are combined to form a nucleus and thereafter react with the surrounding unreacted components to generate crystal growth. By this, CdSe quantum dots are fabricated. Here, the particle size of the CdSe quantum dots can be controlled by adjusting the reaction time.

Next, a zinc oxide solution in which zinc oxide is dissolved in oleic acid and a sulfur solution in which sulfur is dissolved in oleic acid are prepared.

Subsequently, the zinc oxide solution and the sulfur solution are alternately dropwise added in a trace amount into the CdSe quantum dot solution adjusted to a predetermined temperature (for example, 150° C.), and the resultant is heated, cooled, and washed to remove the excessive organic components in the solution. Then, the resultant is thereafter dispersed into a dispersion solvent, for example, into chloroform, thereby to fabricate a CdSe/ZnS dispersion solution.

Then, the surfactant 12 such as HDA is added to the above CdSe/ZnS dispersion solution, and the surface of the quantum dots 9 made of CdSe/ZnS is covered with the surfactant 12, thereby to fabricate a quantum dot dispersion solution.

Then, with use of this quantum dot dispersion solution, a light-emitting element is fabricated by a method as shown in FIGS. 3(a)-3(b) and 4(c)-4(d).

Figure 3A:
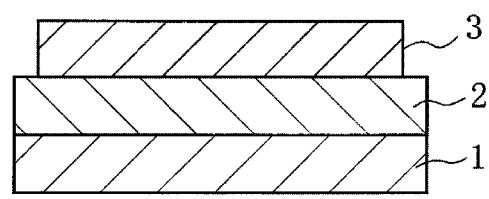
FIGS. 3(a) and 3(b) are a production step view (1/2) schematically illustrating one embodiment (first embodiment) of a method of producing a light-emitting element according to the present invention.

First, as shown in FIG. 3(a), a positive electrode 2 of ITO film or the like having a film thickness of 100 nm to 150 nm is formed on a transparent substrate 1 by the sputtering method or the like. Subsequently, by using the vacuum vapor deposition method or the like, a hole transport layer 3 having a film thickness of 10 to 50 nm is formed on the positive electrode 2.

Figure 3B:
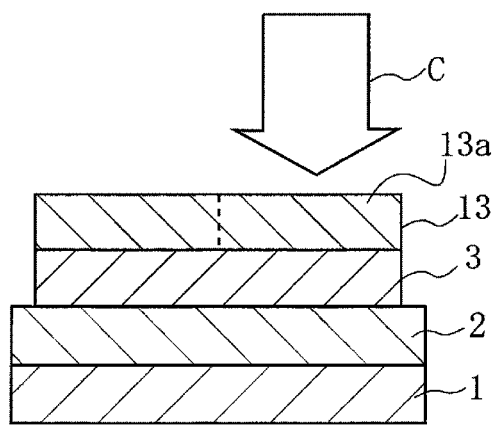

Then, by using the spin coating method or the like, the above-described quantum dot dispersion solution is applied onto the hole transport layer 3 and dried to form a quantum dot layer 13 having a film thickness of 2 to 50 nm as shown in FIG. 3(b).

Next, a specific region 13a of the quantum dot layer 13 is subjected to a thermal treatment by laser radiation or the like as shown by an arrow C, and thus a surfactant 12 on the specific region 13a is removed. Here, the thermal treatment temperature is preferably a temperature around the boiling point of the surfactant 12 that is put to use. For example, when HDA (boiling point: 330° C.) is used as the surfactant 12, the thermal treatment temperature is set to be 300 to 350° C. When octylamine (boiling point: 176° C.) is used as the surfactant 12, the thermal treatment temperature is set to be 160 to 180° C.

By suitably selecting the surfactant in this manner, the width of material selection for the hole transport layer 3 can be enlarged. For example, when HDA is selected as the surfactant 12, a hole-transporting material that can withstand the thermal treatment temperature of 300 to 350° C., for example, $MoO_3$, needs to be used. However, when octylamine that can be removed at a thermal treatment temperature of about 160 to 180° C. is used, an organic compound that is inferior in thermal resistance can be used as the hole-transporting material.

Figure 4C:
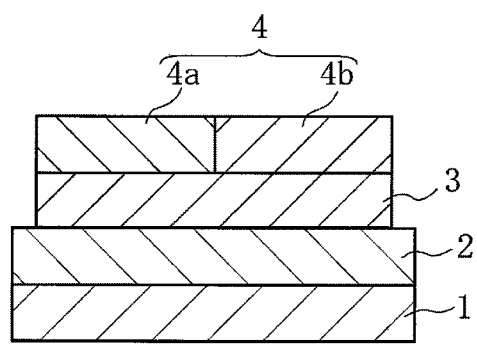
FIGS. 4(c) and 4(d) are a production step view (2/2) schematically illustrating one embodiment (first embodiment) of a method of producing a light-emitting element according to the present invention.

In this manner, a light-emitting layer 4 having a light-emitting region 4a and a non-light-emitting region 4b can be fabricated as shown in FIG. 4(c).

Figure 4D:
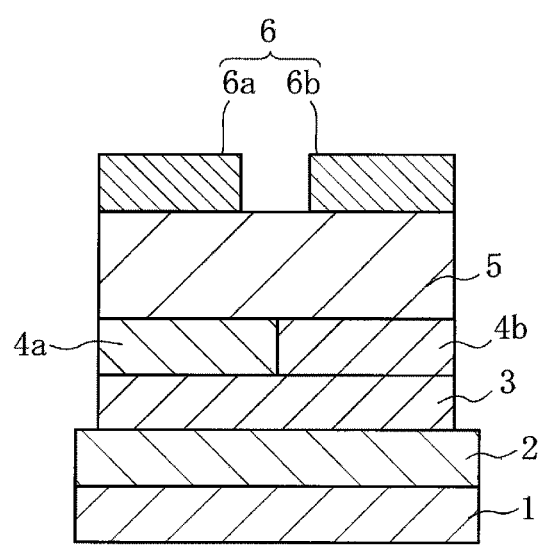

Subsequently, as shown in FIG. 4(d), by using an electron-transporting material such as Alq3, a second light-emitting layer 5 having a film thickness of 50 nm to 70 nm serving also as an electron transport layer is formed on the surface of the light-emitting layer 4 by the vacuum vapor deposition method.

Thereafter, with use of Al, Ca, or the like, a negative electrode 6 (first and second negative electrodes 6a, 6b) having a film thickness of 100 nm to 300 nm is formed by the vacuum vapor deposition method, whereby the light-emitting element is fabricated.

In this manner, in the present first embodiment, the light-emitting region 4a defining light emission and non-light-emission can be patterned simply depending on whether the surfactant 12 is present or not on the surface of the quantum dots 9 contained in the light-emitting layer 4. Specifically, the light-emitting region 4a can be patterned without using a cumbersome method such as the photolithography method. Therefore, a light-emitting element having good light-emission characteristics can be obtained at a high efficiency and with a low cost without the presence of a residue of the photoresist in the light-emitting layer and without the need for consideration of chemical resistance at the time of material selection. Also, the film thickness of the light-emitting layer 4 can be controlled easily in the film forming process, so that the film thickness can be formed uniformly or approximately uniformly, and unevenness is not generated in the light-emission characteristics. Moreover, the element will not have high resistance as in Patent Document 2, so that the element can be driven by application of low voltage.

Also, because the second light-emitting layer 5 is formed on the surface of the light-emitting layer 4, the part of the light-emitting layer 4 corresponding to the non-light-emitting region 4b can be allowed to emit light in the second light-emitting layer 5. Specifically, the leakage current passing through the surface defects from the quantum dots in the non-light-emitting region 4b of the light-emitting layer 4 increases, whereby electric charge is concentrated in the second light-emitting layer 5 to allow the second light-emitting layer 5 to emit light, and light of different wavelengths can be emitted from one light-emitting element. Moreover, since the second light-emitting layer 5 serves also as an electron transport layer, the element structure can be simplified.

Here, in the present first embodiment, the negative electrode 6 is formed on the second light-emitting layer 5; however, an electron injection layer made of LiF or the like may be interposed between the second light-emitting layer 5 and the negative electrode 6 so as to facilitate injection of electrons in accordance with the needs.

Figure 5:
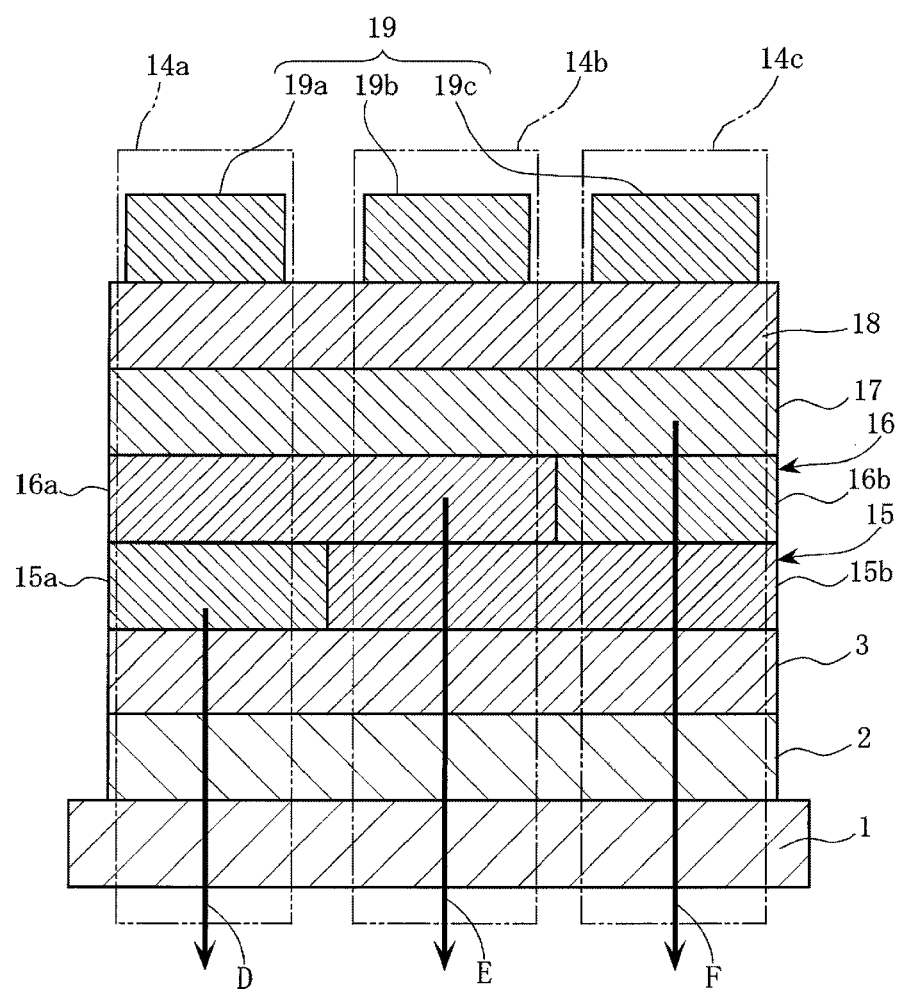
FIG. 5 is a cross-sectional view schematically illustrating a second embodiment of a light-emitting element according to the present invention.

FIG. 5 is a cross-sectional view schematically illustrating a second embodiment of a light-emitting element according to the present invention. In this second embodiment, the light-emitting layer is made to have a three-layer structure and has first to third element parts 14a to 14c.

Specifically, also in the present second embodiment, the positive electrode 2 is formed on the transparent substrate 1, and further the hole transport layer 3 is formed on the surface of the positive electrode 2 in the same manner as in the first embodiment.

Then, a light-emitting layer (first to third light-emitting layers 15 to 17) including a three-layer structure is formed on the surface of the hole transport layer 3. The first light-emitting layer 15 has, for example, a light-emitting region 15a that emits blue light having a wavelength of 490 nm and a non-light-emitting region 15b that does not emit light. The second light-emitting layer 16 has, for example, a light-emitting region 16a that emits green light having a wavelength of 540 nm and a non-light-emitting region 16b that does not emit light. Also, the third light-emitting layer 17 is made only of a light-emitting region that emits red light having a wavelength of 620 nm, for example.

Then, each of the light-emitting layers 15 to 17 is formed so that at least a part of the non-light-emitting region and at least a part of the light-emitting region may overlap with each other. Specifically, the first to third light-emitting layers 15 to 17 are formed so that a part of the non-light-emitting region 15b of the first light-emitting layer 15 and a part of the light-emitting region 16a of the second light-emitting layer 16 may overlap with each other, and the non-light-emitting region 16b of the second light-emitting layer 16 and a part of the light-emitting region of the third light-emitting layer 17 may overlap with each other.

Then, an electron transport layer 18 is formed on the surface of the third light-emitting layer 17, and further a negative electrode 19 (first to third negative electrodes 19a to 19c) is formed on the surface of the electron transport layer 18.

In the present second embodiment, when voltage is applied between the negative electrode 19 (first to third negative electrodes 19a to 19c) and the positive electrode 2, electrons are injected into the negative electrode 19, and holes are injected into the positive electrode 2 in the same manner as in the first embodiment. Then, the electrons injected into the negative electrode 19 pass through the electron transport layer 18 to enter the quantum dots 9 of the first to third light-emitting layers 15 to 17, and the holes injected into the positive electrode 2 pass through the hole transport layer 3 to enter the quantum dots 9 of the first to third light-emitting layers 15 to 17.

Then, in the first element part 14a, the surfactant 12 is coordinated on the surface of the quantum dots 9 contained in the first light-emitting layer 15, and the first light-emitting layer 15 forms the light-emitting region 15a. Specifically, in the light-emitting region 15a, the surfactant 12 is coordinated on the surface of the quantum dots 9, so that the electrons and the holes are confined efficiently in the inside of the quantum dots 9 and recombined in the quantum dots 9 to generate exciton light-emission at a high efficiency. As a result, in the first element part 14a, excitation light from the light-emitting region 15a of the first light-emitting layer 15 penetrates through the hole transport layer 3, the positive electrode 2, and the transparent substrate 1, as shown by an arrow D, and outputs, for example, a light-emission color corresponding to the wavelength of 490 nm, that is, a blue light.

Also, in the second element part 14b, the surfactant 12 is not coordinated on the surface of the quantum dots 9 contained in the first light-emitting layer 15, and the excitons are deactivated by thermal radiation to form the non-light-emitting region 15b. On the other hand, the surfactant 12 is coordinated on the surface of the quantum dots 9 contained in the second light-emitting layer 16 located above the first light-emitting layer 15, and the second light-emitting layer 16 forms the light-emitting region 16a. Specifically, in the light-emitting region 16a, the surfactant 12 is coordinated on the surface of the quantum dots 9, so that the electrons and the holes are confined efficiently in the inside of the quantum dots 9 and recombined in the quantum dots 9 to generate exciton light-emission at a high efficiency. As a result, in the second element part 14b, excitation light from the light-emitting region 16a of the second light-emitting layer 16 penetrates through the non-light-emitting region 15b of the first light-emitting layer 15, the hole transport layer 3, the positive electrode 2, and the transparent substrate 1, as shown by an arrow E, and outputs, for example, a light-emission color corresponding to the wavelength of 540 nm, that is, a green light.

Also, in the third element part 14c, the surfactant 12 is not coordinated on the surface of the quantum dots 9 contained in any of the first and second light-emitting layers 15, 16, and the excitons are deactivated by thermal radiation to form the non-light-emitting regions 15b, 16b. On the other hand, the third light-emitting layer 17 is not subjected to a thermal treatment, and the whole region forms the light-emitting region to generate exciton light-emission. Therefore, in the third element part 14c, excitation light from the third light-emitting layer 17 penetrates through the respective non-light-emitting regions 15b, 16b of the first and second light-emitting layers 15, 16, the hole transport layer 3, the positive electrode 2, and the transparent substrate 1, as shown by an arrow F, and outputs, for example, a light-emission color corresponding to the wavelength of 620 nm, that is, a red light.

Next, a method of producing the above light-emitting element will be described.

First, by a method and a procedure similar to those of the first embodiment, three kinds of quantum dot dispersion solutions having different particle sizes are fabricated.

Specifically, with regard to ultrafine particles having a particle size of 10 nm or less, the state of electrons in the material changes and light having a shorter wavelength is emitted by the quantum size effect according as the size of the particles decreases. Therefore, by using ultrafine particles of various particle sizes, various light-emission colors can be obtained from a light-emitting layer using the same material.

Therefore, in the present second embodiment, three kinds of quantum dot dispersion solutions having different average particle sizes are fabricated. For example, in the case of using CdSe/ZnS quantum dots having a core-shell structure, a first CdSe/ZnS dispersion solution having a core particle size (average particle size) of 3.2 nm and emitting blue light having a light-emission wavelength of 490 nm, a second CdSe/ZnS dispersion solution having a core particle size (average particle size) of 3.7 nm and emitting green light having a light-emission wavelength of 540 nm, and a third CdSe/ZnS dispersion solution having a core particle size (average particle size) of 5.6 nm and emitting red light having a light-emission wavelength of 620 nm are fabricated respectively by adjusting the reaction time, and a surfactant such as HDA is added to these, thereby to fabricate the first to third quantum dot dispersion solutions.

Then, by using the spin coating method or the like, the first quantum dot dispersion solution is applied onto the surface of the hole transport layer 3 and dried to form a first quantum dot layer. Thereafter, a specific region of the first quantum dot layer is subjected to a thermal treatment, and then a first light-emitting layer 15 having light-emitting region 15a and a non-light-emitting region 15b is fabricated.

Subsequently, by using the spin coating method or the like again, the second quantum dot dispersion solution is applied onto the surface of the first light-emitting layer 15 and dried to form a second quantum dot layer. Then, a specific region is set so as to overlap with a part of the non-light-emitting region 15b of the first light-emitting layer 15, and the specific region is subjected to a thermal treatment, thereby to fabricate a second light-emitting layer 16 having a light-emitting region 16a and a non-light-emitting region 16b.

Subsequently, by using the spin coating method or the like again, the third quantum dot dispersion solution is applied onto the surface of the second light-emitting layer 16 and dried to form a third light-emitting layer.

Thereafter, by a method and a procedure substantially similar to those of the first embodiment, an electron transport layer 18 of Alq3 or the like having a film thickness of 50 nm to 70 nm is formed on the surface of the third light-emitting layer 17 by the vacuum vapor deposition method.

Then, with use of Ca, Al, or the like, a negative electrode 19 (first to third negative electrodes 19a to 19c) having a film thickness of 100 nm to 300 nm is formed by the vacuum vapor deposition method, whereby the light-emitting element is fabricated.

In this manner, also in the present second embodiment, a light-emitting region defining light-emission and non-light-emission can be patterned simply depending on whether a surfactant is present or not on the surface of the quantum dots 9 contained in the first to third light-emitting layers 15 to 17, and effects similar to those of the first embodiment can be produced.

Moreover, in the present second embodiment, light of different colors can be emitted from the quantum dots of the same material by the quantum size effect, so that a light-emitting element having good light-emission characteristics can be obtained at a high efficiency and with a low cost.

Then, in the present second embodiment, blue light, for example, can be output from the first light-emitting layer 15; green light, for example, can be output from the second light-emitting layer 16; and red light, for example, can be output from the third light-emitting layer 17. Therefore, by arranging a large number of such light-emitting elements in an array form, a display device having a small size and being capable of full-color display with a low cost can be realized.

Here, the present invention is not limited to the above-described embodiments. For example, the method of removing the surfactant is not limited, and by using electron beam irradiation, thermal transcription method, or the like besides the laser irradiation and by performing a local thermal treatment on the quantum dot layer selectively on one sheet of a transparent substrate, patterning of the light-emission pattern on the same transparent substrate can be carried out.

Also, in the case of performing laser irradiation, the kind of laser is not limited, and a laser device having an arbitrary oscillation wavelength such as a diode laser having an oscillation wavelength of 808 nm, an excimer laser having an oscillation wavelength of 308 nm, or a solid laser having an oscillation wavelength of 532 nm can be used.

Also, in each of the above-described embodiments, light of two or more colors is emitted; however, it is a preferable mode that one light-emitting layer is provided and patterned so as to emit light of a single color, whereby a character pattern can be displayed in a single color.

Also, in the above-described embodiments, the hole transport layer 3 is provided on the positive electrode 2; however, the hole transport layer 3 can be omitted when the desired performance is not affected.

Also, in the above-described first embodiment, the electron transport layer needs to have a light-emitting function, so that the electron transport layer is formed of a light-emitting material. However, when the light-emitting function is not required as in the second embodiment, the electron transport layer can be formed of an electron-transporting material that does not have a light-emission property.

Also, in the above-described embodiments, the quantum dot 9 has a core-shell structure made of the core part 10 and one layer of the shell part 11. However, the present invention can be applied also in the same manner to a core-shell-shell structure in which the shell part 11 has a two-layer structure or to a quantum dot that does not have a shell part.

Next, an example of the present invention will be concretely described.

EXAMPLE

A light-emitting element having the above-described constitution shown in FIG. 1 was fabricated, and a light-emission spectrum was measured.

Specifically, an ITO film was formed on a glass substrate by the sputtering method, thereby to form a positive electrode, and then the electrode was washed.

Subsequently, $MoO_3$ having a film thickness of 10 nm was formed on the positive electrode by the vacuum vapor deposition method, thereby to form a hole transport layer.

Next, Evidot600 (quantum dot structure: core-shell structure of CdSe/ZnS, core particle size: 4.7 nm, surfactant: HDA (boiling point: 330° C.), dispersion solvent: toluene) manufactured by Evident Technologies, Inc. was prepared as a quantum dot dispersion solution.

Subsequently, the quantum dot dispersion solution was applied onto the surface of the hole transport layer and dried on a hot plate to evaporate the dispersion solution. Here, for the application treatment, the spin coating method was used, where the rotation number of the spin coating was set to be 3000 rpm and the treatment time was set to be 60 seconds. Also, for the drying treatment, the drying temperature was set to be 100° C., and the drying time was set to be 15 minutes. Here, the film thickness of the formed quantum dot layer was 5 to 20 nm.

Subsequently, after the drying treatment, laser irradiation was carried out on a specific region to perform a thermal treatment, whereby the surfactant on the specific region was removed to form a light-emitting layer having a light-emitting region and a non-light-emitting region. Here, for the laser irradiation, a diode laser having an oscillation wavelength of 808 nm was used, and the laser irradiation was carried out for one minute by setting the irradiation energy to be 80 mJ/cm$^2$ so that the thermal treatment temperature would be about 300° C.

Next, an Alq3 film having a film thickness of 50 nm was formed by using the vacuum vapor deposition method, whereby a second light-emitting layer serving also as an electron transport layer was fabricated.

Subsequently, LiF having a film thickness of 0.5 nm was formed by using the vacuum vapor deposition method, whereby an electron injection layer was formed. Thereafter, Al having a film thickness of 100 nm was formed by using the vacuum vapor deposition method, whereby a negative electrode was fabricated. Finally, then, the element was sealed with use of a glass cap and a UV-curing resin. Then, by this process, a sample of the present invention having a first element part that emits light in the light-emitting region of the light-emitting layer and a second element part that emits light in the second light-emitting layer was obtained.

Next, with respect to the sample of the present invention, voltage was applied between the positive electrode and the negative electrode by using a source meter, and a light-emission spectrum was measured by a multi-channel detector.

Figure 6:
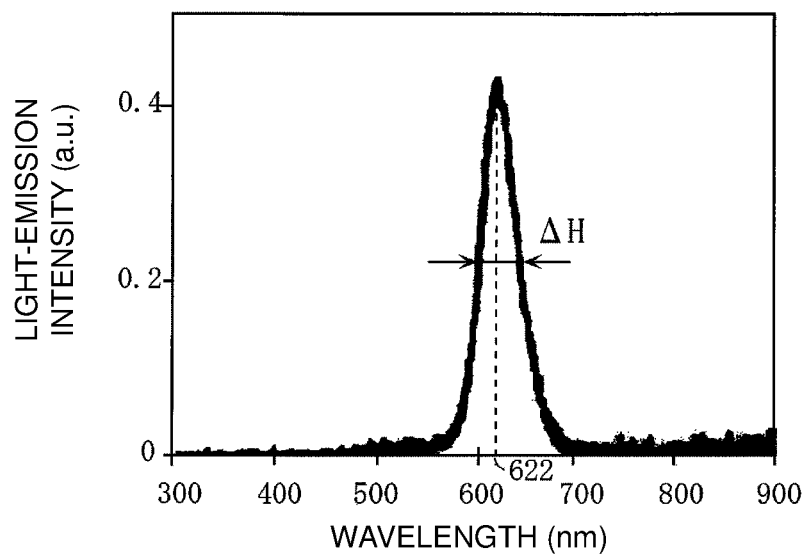
FIG. 6 is a view illustrating a light-emission spectrum obtained from a first element part of Example 1.

FIG. 6 shows a light-emission spectrum in the first element part, where the lateral axis represents a wavelength (nm), and the longitudinal axis represents light-emission intensity (a.u.).

As will be clear from this FIG. 6, red light having a peak wavelength of 622 nm and a half-value whole-width ΔH of 43 nm was obtained from the first element part.

Figure 7:
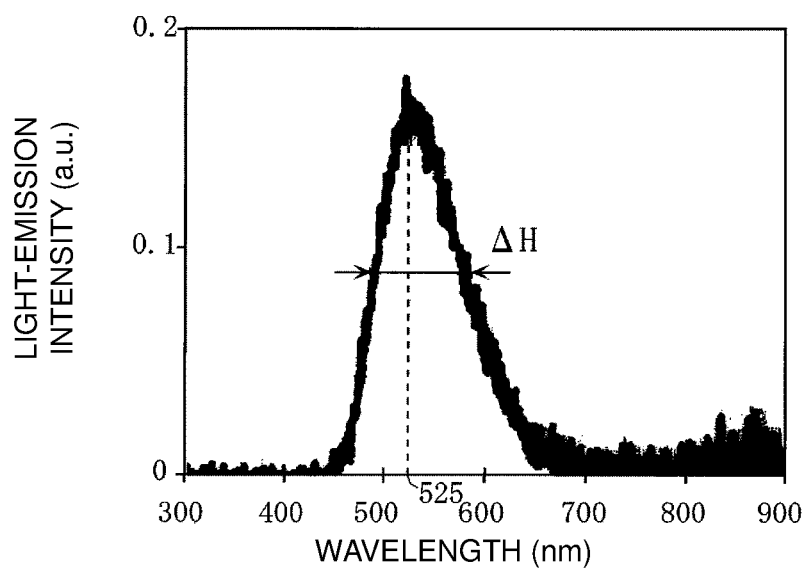
FIG. 7 is a view illustrating a light-emission spectrum obtained from a second element part of Example 1.
Figure 8:
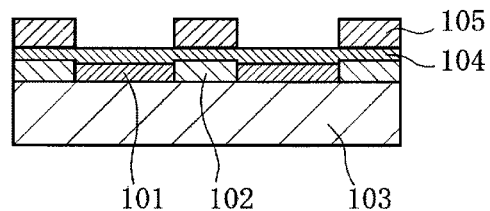
FIG. 8 is a production step view illustrating a patterning method of Patent Document 1.
Figure 8:
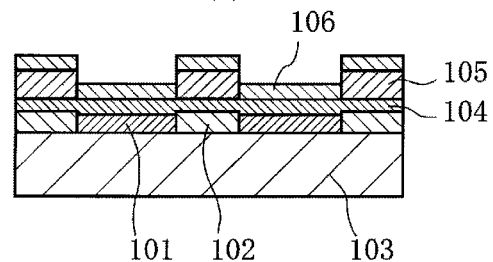
Figure 8:
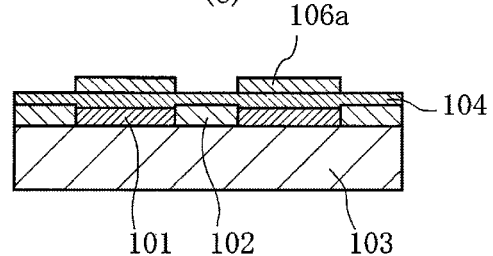
Figure 8:
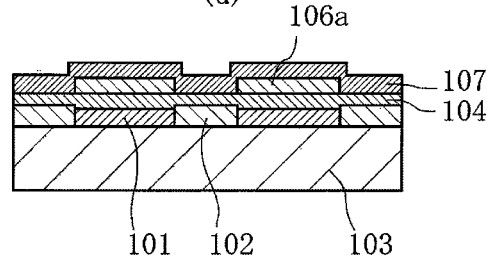
Figure 9:
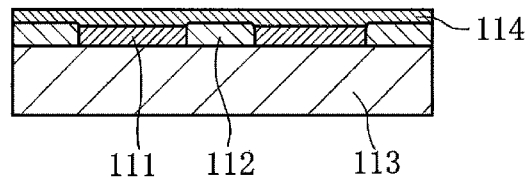
FIG. 9 is a production step view illustrating a patterning method of Patent Document 2.
Figure 9:
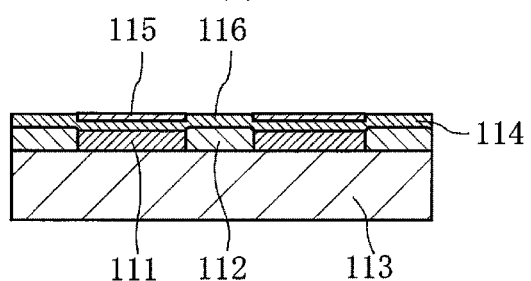
Figure 9:
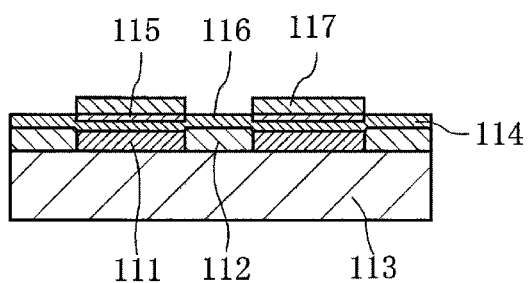
Figure 9:
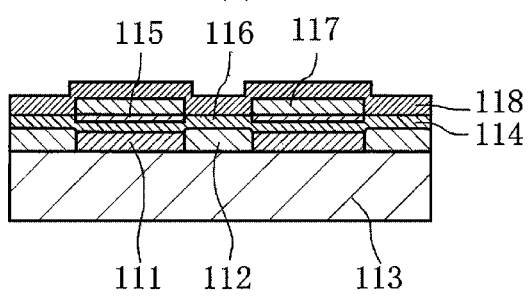

FIG. 7 shows a light-emission spectrum in the second element part, where the lateral axis represents a wavelength (nm), and the longitudinal axis represents light-emission intensity (a.u.).

As will be clear from this FIG. 7, green light having a peak wavelength of 525 nm and a half-value whole-width ΔH of 90 nm was obtained from the second element part.

From the above, it has been confirmed that, with the samples of the present invention, desired light-emission colors that have a sharp light-emission spectrum and good light-emission characteristics and are different between the first element part and the second element part is obtained.

A light-emitting element is realized in which patterning of a light-emitting region defining light-emission and non-light-emission can be carried out easily without the need for cumbersome steps, and good light-emission characteristics can be obtained at a high efficiency and with a low cost.

DESCRIPTION OF REFERENCE SYMBOLS 2 positive electrode (electrode)
3 hole transport layer
4 light-emitting layer
4a light-emitting region
4b non-light-emitting region
5 second light-emitting layer serving also as electron transport layer
6 negative electrode
9 quantum dot
10 core part
11 shell part 12 surfactant
13 quantum dot layer
13a specific region
15 first light-emitting layer (light-emitting layer)
15a light-emitting region
15b non-light-emitting region
16 second light-emitting layer (light-emitting layer)
16a light-emitting region
16b non-light-emitting region
17 third light-emitting layer (light-emitting layer)
18 electron transport layer
19 negative electrode

The invention claimed is:

1. A light-emitting element comprising:
a pair of electrodes; and
at least one light-emitting layer containing quantum dots interposed between the pair of electrodes, wherein
the at least one light-emitting layer has a light-emitting region in which a surfactant is present on a surface of the quantum dots and a non-light-emitting region in which the surfactant is absent on the surface of the quantum dots.

2. The light-emitting element according to claim 1, wherein the non-light-emitting region is a thermal treatment non-light-emitting region.

3. The light-emitting element according to claim 1, further comprising a second light-emitting layer adjacent a surface of the at least one light-emitting layer.

4. The light-emitting element according to claim 3, wherein the second light-emitting layer is an electron transport layer.

5. The light-emitting element according to claim 3, wherein the light-emitting region and the second light-emitting layer each emit light having a respectively different wavelength.

6. The light-emitting element according to claim 1, wherein the at least one light-emitting layer is a laminated body of two or more light-emitting layers, each of the two or more light-emitting layers having quantum dots of different average particle sizes.

7. The light-emitting element according to claim 6, wherein the two or more light-emitting layers are configured such that at least a part of the non-light-emitting region of a first light emitting layer and at least a part of the light-emitting region of a second light emitting layer overlap with each other.

8. The light-emitting element according to claim 6, wherein each light-emitting region of the two or more light-emitting layers emits light having a respectively different wavelength.

9. The light-emitting element according to claim 6, further comprising an electron transport layer adjacent a surface of one of the two or more light-emitting layers.

10. The light-emitting element according to claim 1, further comprising a hole transport layer interposed between one electrode of the pair of electrodes and the at least one light-emitting layer.

11. The light-emitting element according to claim 1, wherein the quantum dots have a core-shell structure.

12. A method of producing a light-emitting element including at least one or more light-emitting layers containing quantum dots interposed between a pair of electrodes, the method comprising:
fabricating at least one or more kinds of quantum dots having a surfactant coordinated on the surface;
forming at least one or more quantum dot layers by using each of the one or more kinds of fabricated quantum dots; and
performing a thermal treatment on a specific region of at least one quantum dot layer among the formed quantum dot layers to remove a surfactant on the specific region to fabricate a light-emitting layer having a light-emitting region and a non-light-emitting region.

13. The method of producing a light-emitting element according to claim 12, further comprising forming a second light-emitting layer on a surface of the light-emitting layer.

14. The method of producing a light-emitting element according to claim 13, wherein the second light-emitting layer is an electron transport layer.

15. The method of producing a light-emitting element according to claim 12, wherein two or more kinds of quantum dots having different average particle sizes are fabricated, and quantum dot layer formation and surfactant removal are carried out each of the two or more kinds of quantum dots to form two or more light-emitting layers having different light-emission wavelengths.

16. The method of producing a light-emitting element according to claim 15, wherein the two or more light-emitting layers having different light-emission wavelengths are arranged so that at least a part of the non-light-emitting region of a first light emitting layer and at least a part of the light-emitting region of a second light emitting layer overlap with each other.

17. The method of producing a light-emitting element according to claim 15, further comprising forming an electron transport layer on a surface of an uppermost light-emitting layer among the two or more light-emitting layers.

18. A display device comprising a plurality of light-emitting elements according to claim 1 arranged in an array form.

* * * * *